June 29, 1965 A. J. JORGENSEN 3,192,407
ISOLATION CIRCUIT FOR DIODE SWITCHING ARRAYS
Filed Oct. 29, 1962 2 Sheets-Sheet 1

INVENTOR.
ARNOLD J. JORGENSON
BY
Christie Parker & Hale
ATTORNEYS.

June 29, 1965 A. J. JORGENSEN 3,192,407

ISOLATION CIRCUIT FOR DIODE SWITCHING ARRAYS

Filed Oct. 29, 1962 2 Sheets-Sheet 2

INVENTOR.
ARNOLD J. JORGENSON
BY
Christie, Parker & Hale
ATTORNEYS.

United States Patent Office
3,192,407
Patented June 29, 1965

3,192,407
ISOLATION CIRCUIT FOR DIODE SWITCHING ARRAYS

Arnold J. Jorgensen, Duarte, Calif., assignor to Burroughs Corporation, Detroit, Mich., a corporation of Michigan Filed Oct. 29, 1962, Ser. No. 233,569
1 Claim. (Cl. 307—88.5)

The present invention relates to isolating circuits for diode switching arrays and, more particularly, to a novel circuit combination for materially reducing the effect of stray capacitance in diode switching circuits upon the rate at which digital information may be gated therefrom.

In electronic digital computers and the like it is common to employ arrays of diode switching circuits to perform logical operations in the processing of digital information. In the processing of the digital information it is generally the practice to gate bits of the digital information from each array of switching circuits in a timed sequence and under the control of a series of clock pulses. To accomplish this a gate circuit for receiving the clock pulses is coupled to the output and forms a part of each array.

In addition to the clock pulses, the gate circuit receives the output signal developed by the array in response to a predetermined combination of input signals applied thereto. In the absence of a clock pulse the output current signal developed in the array passes entirely through the gate circuit while the output voltage signal developed by the array is clamped at a predetermined magnitude less than the logical operating level of a following stage of the computer system. When a clock pulse is applied to the gate circuit, the output current signal passes between the array and the following stage while the output voltage changes from its clamped value toward the logical operating level of the following stage.

The time required for the output voltage to reach the logical operating level is a function of the stray capacitance associated with the array of diode switching circuits. The stray capacitance comprises the stray wiring capacitance, the load capacitance, and the diode inter-electrode capacitance. Thus, the larger the diode switching array the larger the total stray capacitance and the greater the time required to reach the logical operating level. Since the clock pulse must be present during the time the output voltage is moving toward the logical operating level and a predetermined time thereafter to insure a proper triggering of the following stage, the time duration of the clock pulse is also controlled by the time required to reach the logical operating level. Thus, the larger the array, the longer the time duration of each clock pulse and the slower the rate at which digital information may be gated from the array of switching circuits. Accordingly, the effects of stray capacitance in diode switching circuits present a direct limitation upon the speed of operation and/or complexity of the arrays of switching circuits which may be employed in a computer system.

In view of the above, the present invention provides an isolation circuit which materially reduces the effects of stray capacitance in diode switching circuits upon the rate at which digital information may be gated therefrom.

Basically, to accomplish this, the isolation circuit of the present invention, in combination with an array of diode switching circuits and a clock pulse gating arrangement, comprises a transistor arranged in a common base configuration. The transistor is connected between the output terminal of the array and a junction of the input of a following stage and the gating circuit for receiving clock pulses. In particular, the emitter-collector circuit of the transistor is connected for series current flow between the output terminal of the array and the input terminal of the following stage as well as for series current flow with the gating circuit. The base terminal of the transistor is connected to a source of biasing potential for biasing the transistor to a normally non-conductive state to become conductive in response to the output signal developed at the output terminal of the array in response to a predetermined combination of input signals applied thereto.

In operation, the transistor is normally non-conducting and no current flows between the array of switching circuits and the following stage. In response to the predetermined combination of input signals applied to the array, an output signal is developed by the array which causes the transistor to become conductive. A current path is then provided for the output signal from the gating circuit through the emitter-collector circuit of the transistor, the gating circuit clamping the voltage of the collector terminal of the transistor at a predetermined value less than the operating level of the following stage. In this state a clock pulse received by the gating circuit causes the voltage at the collector terminal to rapidly change to the operating level of the following stage and allows current to flow through the emitter-collector circuit between the output terminal of the array and the input terminal of the following stage.

The time required for the collector voltage to reach the logical operating level is determined by the capacitance of the gating circuit, the input capacitance of the following stage coupled to the output of the gating circuit, and the output capacitance of the common base transistor. Therefore, the time is independent of the stray capacitance of the diode switching circuits comprising the array and can be kept very small and nearly constant by specifying the components comprising the following stage and gating circuit and by proper selection of the transistor forming the isolation circuit. Accordingly, the size and complexity of the array of diode switching circuits has a negligible effect upon the rate at which digital information may be gated therefrom and upon the required time duration of clock pulses applied to the gating circuit. This means that by employing the present invention, the stray capacitance of diode switching circuits no longer poses a limitation upon the speed of operation and/or complexity of the arrays of diode switching circuits which may be employed in a computer system.

In addition to the above, by employing a common base transistor configuration other advantages are inherent in the isolation circuit of the present invention. For example, the delay introduced by the isolation circuit in the over-all gating of digital information is negligible. Also, the common base transistor configuration provides a voltage gain which may be utilized to compensate for reduction in signal level inherent in the processing of digital information in an array of diode switching circuits. Further, since a common base transistor configuration possesses a high output impedance, reflection problems and power requirements incident to the tapping of clock pulses from the common line carrying the clock pulses to all circuits in the computer system are minimal.

The above, as well as other features of the present invention, may be more clearly understood by reference to the following detailed description when considered with the drawings in which.

Figure 1:
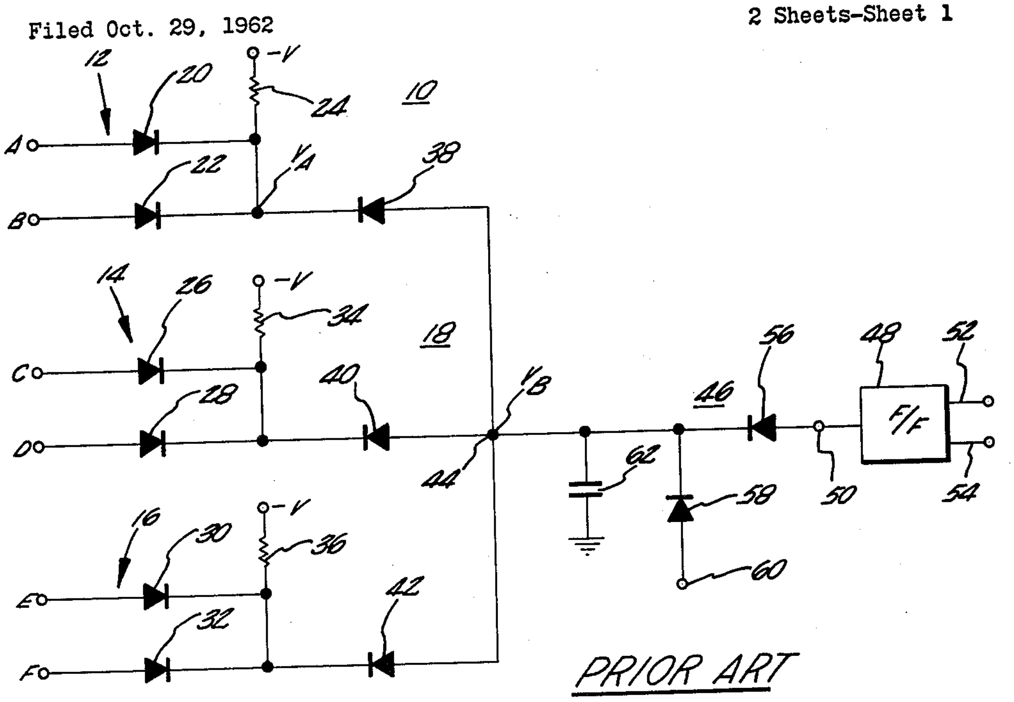
FIGURE 1 is a schematic, block diagram representation of a diode switching and gating circuit arrangement common in the prior art.

Referring to FIGURE 1, there is illustrated a prior art type of switching circuit in which an array 10 of diode switching circuits includes a combination of three AND circuits 12, 14 and 16 in combination with a single OR circuit 18. The AND circuit 12 includes a pair of diodes 20 and 22 having their anodes coupled to input terminals designated as A and B, respectively, and their cathodes coupled to one terminal of a resistor 24. The resistor 24, in turn, is coupled to a source of biasing potential represented as —V.

In a similar manner the AND gates 14 and 16 includes dodes 26, 28, 30 and 32 having their anodes coupled to the input terminals designated C, D, E, F, respectively, and their cathodes coupled to a pair of resistors 34 and 36, as illustrated. The resistors 34 and 36 are also coupled to the source of biasing potential —V.

The OR gate 18 includes three diodes 38, 40 and 42. The diodes 38, 40 and 42 have their anodes coupled to a common output terminal 44 and their cathodes coupled to the cathodes of the diodes comprising the AND gates 12, 14 and 16, respectively.

In operation, the AND gates 12, 14 and 16 may be said to be in a "false" condition when either one or both of their associated diodes are forward biased by the application of a relatively positive input potential. In the false condition, current flows through the forward biased diodes and their associated resistors to the source of negative potential —V while the junctions of the diodes and the associated resistors are substantially at ground potential.

The AND gates 12, 14 and 16 may be said to be in a "true" condition when the associated diodes are both back biased by a relatively negative input potential.

The OR gate 18 with its diodes 38, 40 and 42 is arranged to be in a "false" condition when the diodes 38, 40 and 42 are back biased and in a "true" condition when any one of the diodes is forward biased. In particular, the OR gate 18 is arranged to be in a false condition when the AND gates 12, 14 and 16 are false and to be in a true condition when any one of the AND gates 12, 14 and 16 is true. For example, if the AND gate 12 assumes a true condition, the voltage $V_A$ at the junction of the diodes 20 and 22 drops to forward bias the diode 38, causing a drop in the potential at the output terminal 44.

As represented in FIGURE 1, the switching circuit, in addition to the diode switching array 10, also includes a gating circuit 46 and a conventional flip-flop 48 which, by way of example, comprises a second stage of the switching circuit. The flip-flop 48 includes an input terminal 50 and a pair of output terminals 52 and 54 and has a predetermined threshold of operation which must be exceeded to cause the flip-flop to change states.

The gating circuit 46 includes a diode 56 connected, by way of example, to block current flow from the output terminal 44 to the input terminal 50 of the second stage. The gating circuit 46 also includes a diode 58. The diode 58, also by way of example, has its cathode coupled to the output terminal 44 and its anode coupled to an input terminal 60 for receiving clock pulses. Thus, the diode 58 is connected for series current flow between the input terminal 60 and the diode switching circuit 10. Due to the potential applied to the input terminal 60, the diode 58 is normally back biased.

Figure 2:
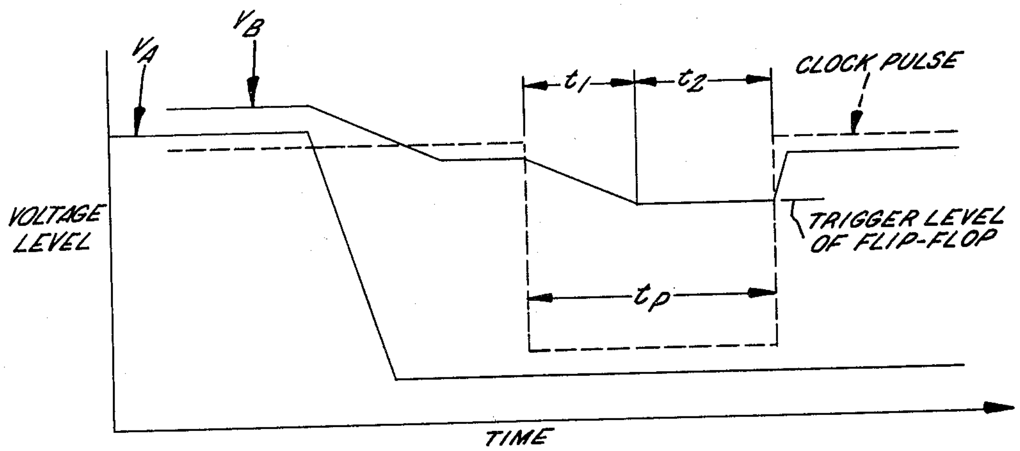
FIGURE 2 is a graphical representation of the voltage levels associated with the switching circuit illustrated in FIGURE 1.

In operation, when one of the AND circuits, such as 12, assumes a true condition, the voltage $V_A$ drops (see FIGURE 2). When this occurs the diode 38 is forward biased and the voltage $V_B$ at the output terminal 44 of the diode switching circuit 10 goes negative until the diode 58 becomes forward biased. During the time the voltage $V_B$ is going negative, the stray capacitance associated with the diode switching circuit 10 and represented by the capacitor 62 is being charged. Thus, in effect, current is flowing from ground through the capacitor 62, the diode 38, the resistor 24 to the source of negative potential —V. When the diode 58 is forward biased the potential at the output terminal 44 is clamped and current flows from a source of clock pulses (not shown) coupled to the input terminal 60 through the diode 58, the diode 38, and resistor 24, to —V. Thus, the diode 58 provides a bypass from the input terminal 50 for the switching current signal developed in the array 10 in response to a predetermined combination of input signals applied thereto, i.e. a combination of input signals causing the OR circuit 18 to assume a true condition.

If a clock pulse, as illustrated in FIGURE 2, is then applied to the input terminal 60, the diode 58 becomes back biased and current again effectively flows from ground to continue to charge the stray capacitance 62 through the diode 38 and the resistor 24. The voltage $V_B$ again heads in a negative direction until the level of operation of the second stage is reached. When the level of operation of the second stage is reached the diode 56 is forward biased and current passes between the input terminal 50 and the output terminal 44 of the diode switching circuit 10 to supply energy to the flip-flop 48.

The rate at which the voltage $V_B$ reaches the level of operation of the second stage is directly a function of the switching current developed by the array 10 and the value of the stray capacitance 62. It may be assumed that the switching current is substantially constant. Thus, the time $t_1$ required for the voltage $V_B$ to reach the level of operation of the second stage is a direct function of the value of the stray capacitance 62. As previously mentioned, the stray capacitance comprises the stray wiring capacitance, the output capacitance, and the interelectrode capacitance of the diodes comprising the array 10. Accordingly, the size and complexity of the array determines the value of the stray capacitance. The more complex the diode switching arrangement, the greater the value of the stray capacitance and the longer the time $t_1$ required for the voltage to reach the predetermined level of operation.

Since the clock pulse must be present at the input terminal 60 during the time $t_1$, for which the voltage $V_B$ is moving toward the logical operation level and a predetermined time $t_2$ thereafter to insure a proper triggering of the second stage, the time duration $t_p$ of the clock pulse is also controlled by $t_1$. Thus, the larger the array the longer the time duration $t_p$ of the clock pulse and the slower the rate at which digital information may be gated from the array 10. Accordingly, in the prior art type of diode switching circuits, the effects of stray capacitance pose a direct limitation upon the speed of operation and/or complexity of the arrays of diode switching circuits which may be employed in the computer system.

Figure 3:
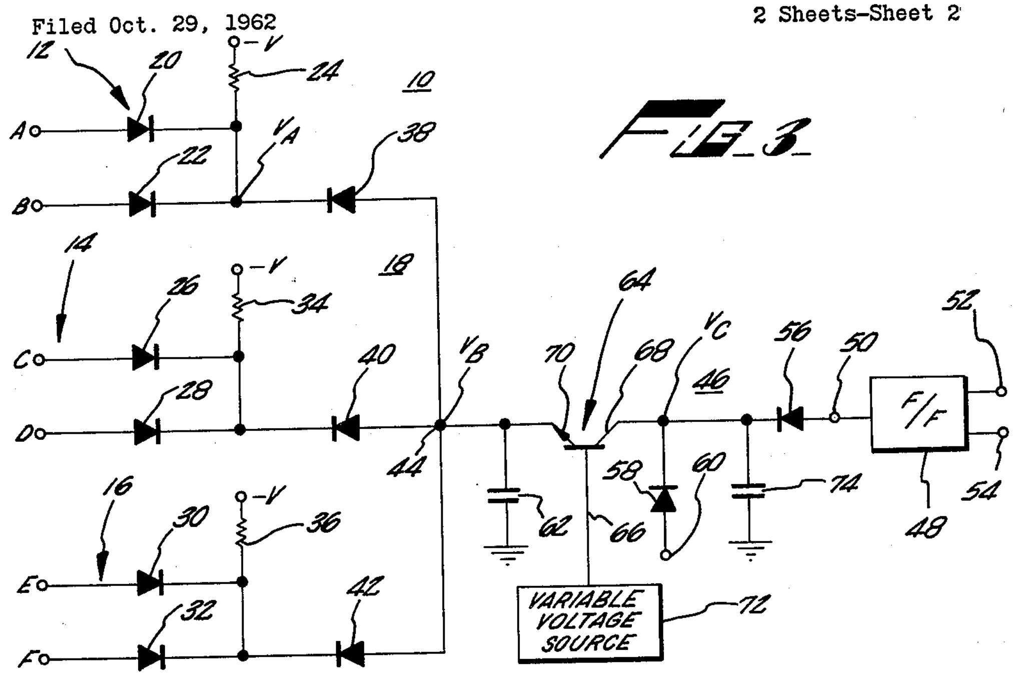
FIGURE 3 is a schematic, block diagram representation of a diode switching and gating circuit employing the isolation circuit of the present invention.

To overcome these problems, the present invention provides an isolation circuit for combination with the prior art type of diode switching circuit which materially reduces the effects of stray capacitance upon the rate at which digital information may be gated therefrom. One form of the present invention is illustrated in FIGURE 3 in combination with a prior art type of switching arrangement such as previously described in connection with FIGURE 1. Since a major portion of the circuit elements illustrated in FIGURE 3 are the same as described in connection with FIGURE 1, only the essential differences of the circuitry relating to the present invention will be hereinafter described in detail.

As illustrated, the isolation circuit of the present invention comprises a transistor 64 having a base terminal 66, a collector terminal 68 and an emitter terminal 70. By way of example, the transistor 66 is an NPN type transistor arranged in a common base configuration with its collector terminal 68 connected to a junction of the diodes 56 and 58 comprising the gating circuit 46 and its emitter connected to the output terminal 44 of the array diode switching circuits 10. In this manner the emitter-collector circuit of the transistor 64 is connected for series current flow between the input terminal 50 of the second stage of the system and the output terminal 44 of the array 10 and for series current flow with the diode 58 of the gating circuit 46.

The base terminal 66 of the transistor 64 is preferably coupled to a variable source of biasing potential 72. By control of the source 72 the value of the potential applied to the base terminal 66 may be adjusted to be normally slightly negative relative to the emitter terminal 70 irrespective of the shift in the D.C. signal levels which occur in the array 10 between −V and the output terminal 44 due to the voltage drops across the diodes comprising the array. Accordingly, the transistor 64 is normally biased to a non-conductive state. Also, the biasing arrangement is so arranged that when the switching current signal is developed at the output terminal 44 in response to a predetermined combination of input signals applied thereto and the voltage $V_B$ goes negative in response to a forward biasing of one of the diodes comprising the OR gate 18, the transistor 64 becomes conductive.

Figure 4:
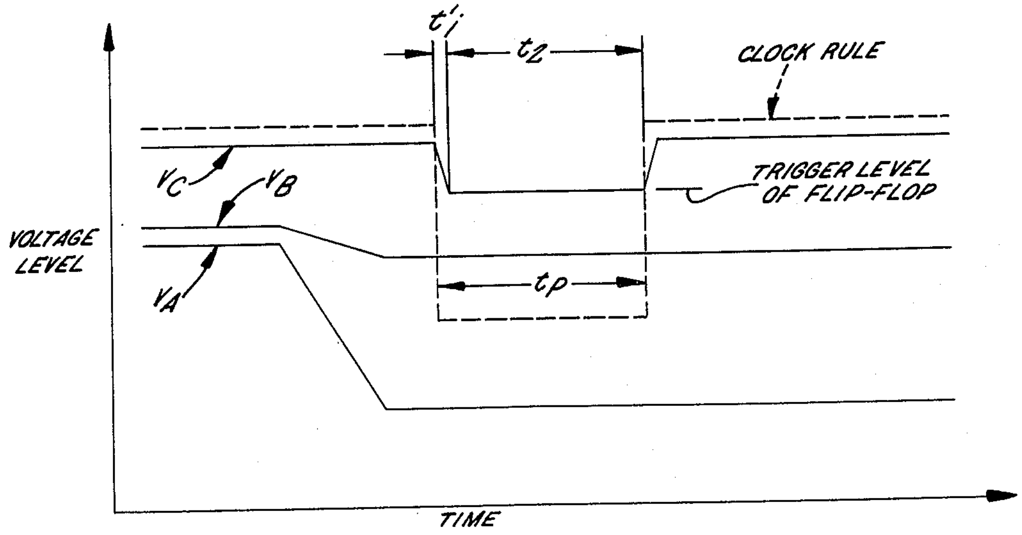
FIGURE 4 is a graphical representation of the voltage level associated with the switching circuit illustrated in FIGURE 3.

In operation, then, the transistor 64 is normally nonconducting and no current flows between the output terminal 44 and the input terminal 50 of the second stage of the system. In response to a predetermined combination of input signals applied to the switching circuit, one or more of the AND circuits 12, 14 and 16 assumes a true condition. For example, when the AND gate 12 goes true the voltage $V_A$ drops, as illustrated in FIGURE 4. When this occurs, the diode 38 is forward biased causing a drop in the voltage $V_B$. As described in connection with FIGURE 1, while the voltage $V_B$ is dropping the stray capacitance 62 associated with the array 10 is charged through the diode 38 and the biasing resistor 24. When the value of the voltage $V_B$ becomes less than the voltage at the base terminal 66 as controlled by the source 72, the transistor 64 becomes conductive to clamp the voltage at the output terminal 44 as illustrated in FIGURE 4. The switching current then flows through the forward biased diode 58, the emitter-collector circuit of the transistor 64, the diode 38 and the biasing resistor 24.

If a clock pulse is then applied to the input terminal 60, the diode 58 becomes back biased and the voltage $V_C$ at the collector terminal 68 rapidly drops to the logical operating level of the second stage. As this occurs the diode 56 becomes forward biased to pass the switching current between the output terminal 44 and the input terminal 50 of the second stage through the emitter-collector circuit of the transistor 64. The voltage $V_C$ remains substantially at the logical operating level of the second stage for the period of time $t_2$ to insure a proper triggering of the second stage at which time the clock pulse is terminated.

The time $t_1'$ required for the voltage $V_C$ to change to the operating level of the second stage is a function of the switching current flowing through the emitter-collector circuit and the capacitance associated with the input of the second stage. The capacitance is illustrated by a capacitor 74 connected between ground and a junction of the diodes 56 and 58 and comprises the input capacitance of the second stage, the junction capacitance of the diode 58 and the output capacitance of the transistor 64. During the time the voltage $V_C$ is dropping to the operating level of the second stage, the switching current is flowing to charge the capacitance represented by the capacitor 74 and hence is effectively flowing from ground through the capacitor 74, the diode 56, and the emitter-collector circuit to the array 10. Since the switching current is nearly constant, the time $t_1'$ is almost entirely a function of the capacitance of the capacitor 74. Therefore, $t_1'$ is independent of the size and arrangement of the diode switching circuits comprising the array 10 and may be kept very small and nearly constant by specifying the components comprising the input circuit of the second stage and by proper selection of the diode 58 and the transistor 64.

Thus, by employing the present invention, the required time duration of the clock pulses, $t_p$, is materially reduced and may be nearly equal to the time $t_2$. The shortened time duration of the clock pulses, in turn, materially increases the rate at which digital information may be gated from the array of diode switching circuits 10. Accordingly, stray capacitance inherent in an array of diode switching circuits does not affect the rate at which digital information may be gated from the array and digital computers employing the present invention may utilize as complex a diode switching arrangement as desired while maintaining rapid gating of digital information.

In addition to the above, by employing a common base transistor configuration other advantages are inherent in the isolation circuit of the present invention. For example, the delay introduced by the isolation circuit in the over-all gating of digital information is negligible. Also, the common base transistor configuration provides a voltage gain which may be utilized to compensate for reduction in signal level inherent in the processing of digital information in an array of diode switching circuits. Further, since a common base transistor configuration possesses a high output impedance, reflection problems and power requirements incident to the tapping of clock pulses from the common line carrying the clock pulses to all circuits in computer systems are minimal.

What is claimed is:

A logical switching system, comprising:

a switching circuit for developing a switching current at its output terminal in response to a predetermined combination of input signals applied to its input terminals, the switching circuit having an effective capacitance at its output that must be charged by the switching current;

a transistor having an emitter-collector circuit and a base terminal, the emitter-collector circuit being connected for series current flow between the output terminal of the switching circuit and an input terminal of a second stage of the switching system;

means including a source of biasing potential connected to the base terminal of the transistor for biasing the transistor to a normally non-conductive state to become conductive in response to the switching current developed at the output terminal of the switching circuit, the transistor when conductive permitting the effective capacitance of the switching circuit to be charged;

and a diode having a first terminal connected to the input terminal of the second stage and a second terminal connected to the source of clock pulses, the diode being arranged for series current flow with the emitter-collector circuit, the source of clock pulses between pulses normally forward biasing the diode when the transistor is conducting to bypass the switching current from the input terminal of the second stage, and the source of clock pulses during a clock pulse back biasing the diode to permit current flow between the second stage and the switching circuit.

References Cited by the Examiner

UNITED STATES PATENTS

| | | | |
|---|---|---|---|
| 2,997,606 | 8/61 | Hamburger et al. | 307—88.5 |
| 3,041,473 | 6/62 | Piazza | 307—88.5 |
| 3,099,720 | 7/63 | Gotthardt | 307—88.5 |

OTHER REFERENCES

Diode Coincidence and Mixing Circuit in Digital Computer, Proceedings of I.R.E., May 1958.

DAVID J. GALVIN, *Primary Examiner.*